(12) United States Patent
Harris et al.

(10) Patent No.: US 6,869,818 B2
(45) Date of Patent: Mar. 22, 2005

(54) METHOD FOR PRODUCING AND TESTING A CORROSION-RESISTANT CHANNEL IN A SILICON DEVICE

(75) Inventors: James M. Harris, Menlo Park, CA (US); Sapna Patel, Fremont, CA (US)

(73) Assignee: Redwood Microsystems, Inc., Menlo Park, CA (US)

( * ) Notice: Subject to any disclaimer, the term of this patent is extended or adjusted under 35 U.S.C. 154(b) by 0 days.

(21) Appl. No.: 10/298,847

(22) Filed: Nov. 18, 2002

(65) Prior Publication Data

US 2004/0096992 A1 May 20, 2004

(51) Int. Cl.[7] .............................................. H01L 21/00
(52) U.S. Cl. ............................ 438/50; 438/48; 438/51; 438/117
(58) Field of Search ............................ 438/48, 50, 51, 438/52, 53, 117

(56) References Cited

U.S. PATENT DOCUMENTS

| | | | |
|---|---|---|---|
| 4,058,430 A | 11/1977 | Suntola et al. | 156/611 |
| 4,966,646 A | 10/1990 | Zdeblick | 156/633 |
| 5,364,497 A * | 11/1994 | Chau et al. | 216/39 |
| 5,451,371 A * | 9/1995 | Zanini-Fisher et al. | 422/51 |
| 5,501,893 A | 3/1996 | Laermer et al. | 428/161 |
| 5,602,671 A | 2/1997 | Hornbeck | 359/224 |
| 5,759,635 A | 6/1998 | Logan | 427/490 |
| 6,087,017 A | 7/2000 | Bibber | 428/458 |
| 6,096,149 A * | 8/2000 | Hetrick et al. | 156/155 |
| 6,129,331 A | 10/2000 | Henning et al. | 251/11 |
| 6,132,808 A | 10/2000 | Brown et al. | 427/387 |
| 6,143,659 A | 11/2000 | Leem | 438/688 |
| 6,149,123 A | 11/2000 | Harris et al. | 251/11 |
| 6,160,243 A | 12/2000 | Cozad | 219/439 |
| 6,214,473 B1 | 4/2001 | Hunt et al. | 428/469 |
| 6,242,054 B1 | 6/2001 | Baalmann et al. | 427/489 |
| 6,273,985 B1 * | 8/2001 | DeLouise et al. | 156/273.3 |
| 6,325,886 B1 | 12/2001 | Harris et al. | 156/314 |
| 6,379,492 B2 | 4/2002 | Bang et al. | 156/345 |
| 6,416,870 B1 | 7/2002 | Hunt et al. | 428/450 |

OTHER PUBLICATIONS

J.W. Coburn; "Plasma–Assisted Etching"; Plasma Chemistry and Plasma Processing; vol. 2, No. 1; pp. 1–40; 1982.

"New Standard: Guideline for Gas Compatability with Silicon MEMS Devices"; SEMI Blue Draft Document 3520; May 2, 2002.

Ibbotson et al.; "Plasmaless dry etching of silicon with fluorine–containing compounds"; J. Appl. Phys 56(10); Nov. 15, 1984; pp. 2939–2943.

(List continued on next page.)

*Primary Examiner*—Kevin M. Picardat
(74) *Attorney, Agent, or Firm*—Law Office of Tina M. Lessani

(57) ABSTRACT

A method for producing a corrosion-resistant channel in a wetted path of a silicon device enables such device to be used with corrosive compounds, such as fluorine. A wetted path of a MEMS device is coated with either (1) an organic compound resistant to attack by atomic fluorine or (2) a material capable of being passivated by atomic fluorine. The device is then exposed to a gas that decomposes into active fluorine compounds when activated by a plasma discharge. One example of such a gas is $CF_4$, an inert gas that is easier and safer to work with than volatile gases like $ClF_3$. The gas will passivate the material (if applicable) and corrode any exposed silicon. The device is tested in such a manner that any unacceptable corrosion of the wetted path will cause the device to fail. If the device operates properly, the wetted path is deemed to be resistant to corrosion by fluorine or other corrosive compounds, as applicable.

13 Claims, 7 Drawing Sheets

OTHER PUBLICATIONS

Andersson et al.; "Hydrophobic valves of plasma deposited octafluorocyclobutane in DRIE channels"; Sensors and Actuators B 75; 2001; pp. 136–141.

d'Agostino et al.; "Diagnostics and Decomposition Mechanism in Radio–Frequency Discharges of Fluorocarbons Utilized for Plasma Etching or Polymerization"; Plasma Chemistry and Plasma Processing, vol. 2, No. 3; 1982.

Kwang–Ho Kwan et al.; "The Effects of Fluorine Passivation Using $SF_6$ Plasma on the Corrosion of Al(Cu 1%) at Grain Boundaries"; J. Electrochem. Soc., vol. 145, No. 3; Mar. 1998; pp. 1044–1048.

Niklaus et al.; "Void–Free Full Wafer Adhesive Bonding"; Proceedings of the $13^{th}$ IEEE Conference of Microelectromechanical Systems in Miyazaci, Japan; Jan. 23–27; 2000; pp. 247–252.

Karwacki Jr. et al.; "Preparing a gas delivery system for excimer lasers with fluoring passivation of 316L stainless steel"; MICRO; Feb. 2001.

Suntola et al.; "Surface chemistry of materials deposition at atomic layer level"; Applied Surface Science 100/101; 1996; pp. 391–398.

Pathangey et al.; "Various approaches have been explored to obtain atomic layer controlled growth, but one of the most straightforward growth techniques is molecular beam epitaxy (MBE)"; Vacuum Technology and Coating; May 2000; pp. 33–40.

Grigger et al.; "Chlorine Trifluoride and Perchloryl Fluoride on construction materials"; Materials Protection; Sep. 1964; pp. 53–58.

A.P. Taylor et al.; "Interaction of ClF3 with Metal Alloys"; Semiconductor International; Jul. 1999.

"SEMI Standards Guideline for Gas Compatibility with Silicon MEMS Devices", Draft for Working Group use only, Semiconductor Equipment and Materials International (SEMI), Jan. 10, 2002, pp. 1–16.

Henning et al., "Performance of MEMS–Based Gas Distribution and Control Systems for Semiconductor Processing", In *Proceedings, Micromachined Devices and Components* (SPIE, Bellingham, WA, 1998, P.J. French and K. Chau, eds.), vol. 3514, pp. 159–170.

* cited by examiner (Known Art)

(Known Art)

Apply organic bonding compound, such as BCB, to at least those portions of the wafer corresponding to the wetted path. For multilayer applications, the organic bonding compound may also be applied to the bonding areas of all the wafers.
610

In multilayer applications, bond wafers together with the organic compound
620

Expose wafer structure to a gas (e.g., $CF_4$) that, either spontaneously or when activated by a energy source, decomposes to active fluorine compounds. Exposure is long enough to cause failure in a silicon region in the wetted path unprotected by the organic bonding compound.
630

Test wafer structure
640

End

Figure 6

Process Flow

| | Upper Silicon Process |
|---|---|
| 1 | Select 500 μm with 1.5 μm field ox. |
| 2 | Double sided align and expose |
| 3 | Etch Oxide 6:1 BOE, 30 ± 5°C, 10min, Dump rinse 5 cycles. |
| 4 | KOH 1 etch |
| 5 | Strip Oxide 6:1 BOE |
| 6 | Field Oxidation, 1100°C |
| 7 | Nitride deposition, 2000Å |
| 8 | Align & expose |
| 9 | Plasma etch nitride |
| 10 | Etch Oxide 6:1 |
| 11 | Single Side KOH Etch Process |
| 12 | Single side patterning |
| 13 | Align & expose |
| 14 | Plasma etch nitride |
| 15 | Etch Oxide 6:1 BOE, 30 ± 5°C, 10min, Dump rinse 5 cycles. |
| 16 | Fast silicon etch, to 50 ± 2 μm diaphragm |
| 17 | Ship to Pre-bond inventory, needs Nitride/Oxide strip before bond. |

| | Lower Silicon Process |
|---|---|
| 1 | Select silicon 400 μm DSP with 1.5μm field oxide and 2000Å nitride |
| 2 | Double sided align and expose |
| 3 | Plasma etch nitride, Preheat 100°C, 3 min Descum, 20 min $CF_4+O_2$ |
| 4 | Etch Oxide 6:1 BOE, 30 ± 5°C, 10 min, Dump rinse 5 cycles. |
| 5 | KOH 1 etch |
| 6 | Etch Oxide 6:1 BOE, 30 ± 5°C, 10 min, Dump rinse 5 cycles. |
| 7 | KOH2 Etch Process: |
| 8 | Inventory as 100 sccm Lower Silicon |

| | Eutectic Bond Process Flow |
|---|---|
| 1 | Select membrane and lower silicon wafers |
| 2 | Strip Nitride and Oxide |
| 3 | Clean wafers |
| 4 | Oxidize 50nm SiO2 on both wafers |
| 5 | Align shadow mask to membrane wafer-flow side |
| 6 | Deposit 200nm aluminum on flow side of membrane wafer |
| 7 | Deposit 200nm aluminum on both sides of lower silicon wafer |

Figure 7(a)

| 8 | Remove SiO2 from bonding regions of membrane wafer |
|---|---|
| 9 | Align membrane and lower silicon wafers to each other |
| 10 | Inspect for proper alignment |
| 11 | Load wafers into cold furnace, ramp to temperature; add weight if desired |
| 12 | At end of cycle, turn off furnace, remove wafer when furnace is cold. |
| 13 | Inspect for proper eutectic bonding |

| | Anodic Bond Process |
|---|---|
| 1 | Pre-anodic clean silicon wafers |
| 2 | Place bonded silicon wafers in 120°C oven to dry |
| 3 | Pre-anodic clean pyrex wafer |
| 4 | Align Pyrex layer to top of membrane wafer |
| 5 | Anodic Bond |
| 6 | Anneal |
| 7 | Inspect for proper bonding |
| 8 | Add any metal needed on the top of the Pyrex layer (e.g., electrical leads) |

| | Aluminum Passivation and Silicon Etch Process |
|---|---|
| 1 | Load wafer into Plasma reactor |
| 2 | Expose to CF4 at 2 torr for 60 min at 350 watts. |
| 3 | Unload wafers |
| 4 | Inspect |

| | Valve Dicing Step |
|---|---|
| 1 | Tape mount |
| 2 | Dice wafer |
| 3 | Demount and waffle pack good dice |
| 4 | Test good die by extending membrane pneumatically to 200 psig. |

Figure 7(b)

METHOD FOR PRODUCING AND TESTING A CORROSION-RESISTANT CHANNEL IN A SILICON DEVICE

BACKGROUND OF THE INVENTION

1. Field of the Invention

This invention relates generally to silicon devices (including MEMS devices) and more specifically to a method for producing and testing a corrosion-resistant channel in a silicon device.

2. Description of the Background Art

A relatively recent development in the semiconductor industry is to use microelectromechanical systems (MEMS) in semiconductor and pharmaceutical manufacturing processes. MEMS devices are typically silicon chips that include miniaturized mechanical components, such as actuators, mirrors, levers, diaphragms, or sensors. MEMS devices may also include electronic circuitry.

When MEMS devices are employed in semiconductor and pharmaceutical manufacturing processes, they are exposed to the chemical and biochemical substances used in such processes. The part of the MEMS device exposed to fluids (i.e., gases or liquids) during operation is commonly referred to as the "wetted path." The wetted path may be different from the primary flow path (i.e., the path along which the fluid is intended to travel) because fluids sometimes can enter into open spaces other than the primary flow path, referred to as the "dead volume"

The materials of the MEMS device that form the wetted path must be able to withstand corrosion or attack from fluids flowing through the device. In applications where corrosive fluids are present, the materials in the wetted path are critical, and compatibility of all the materials present is essential. In products requiring high purity, such as those used in the semiconductor or pharmaceutical industries, even a small amount of corrosion is unacceptable.

In many MEMS devices the wetted path is formed from a silicon channel, as MEMS devices are usually comprised at least in part by silicon wafers. The microvalve illustrated in FIGS. 1(a) and (b), in "off" and "on" states, respectively, is an example of a MEMS device with silicon in the wetted path. The valve is used to finely control the flow of fluids. The microvalve includes a heater plate 22, a diaphragm plate 28, and a channel plate 30.

The channel plate 30, which is formed from a silicon wafer, includes an input port 32 and an output port 34. The illustrated valve is a normally-open valve in that fluid entering input port 32 normally is able to travel freely through the valve 100 and out via output port 34, as depicted in FIG. 1(a). An example of a normally-closed valve is described in U.S. Pat. No. 6,149,123 (the "'123 patent"), the contents of which are incorporated by reference as if fully disclosed herein.

The diaphragm plate 28 includes a cavity 41 which holds a thermopneumatic liquid. The thermopneumatic liquid also extends up through channels 56 in the heater plate 22. When control circuitry (not shown) associated with the valve indicate the valve should close, the heater plate 22 warms the thermopneumatic liquid. The diaphragm plate 28, which is formed from a silicon wafer, includes a flexible diaphragm 44. When the thermopneumatic liquid is heated, it expands, causing the diaphragm 44 to bend and block input port 32. As illustrated in FIG. 1(b), when the input port 32 is blocked, the valve is closed and any fluid flow is severely restricted (e.g., less than 1 sccm).

The wetted path of valve 100 is cavity 43, the input and output ports 32, 34, and any exposed surfaces around the foregoing, all of which are formed from channel plate 30 and diaphragm plate 28. As these two plates 28, 30 are made of silicon wafers, the wetted path is a silicon channel.

A valve similar in operation to valve 100 is described in U.S. Pat. No. 4,996,646 (the "'646 patent"). Another example of a normally-open valve is described in U.S. Pat. No. 6,129,331 (the "'331 patent"). The contents of the '646 patent and the '331 patent are incorporated by reference as if fully disclosed herein.

As stated above, the fluids flowing through MEMS devices, such as the valve illustrated in FIGS. 1(a) and (b), must not corrode the device. For instance, if fluids were to sufficiently corrode the valve of FIGS. 1(a) and (b), the diaphragm 44, which is made up of a thin layer of silicon, would eventually break under operation. In addition, the cleanliness of the semiconductor or pharmaceutical process may be compromised by the products of the reaction of such fluids with the silicon. While silicon is non-reactive with most process gases and single constituent acids, it reacts with atomic fluorine, F, and other compounds which can spontaneously dissociate to atomic fluorine. A silicon atom, Si, will react with fluorine atoms to form $SiF_4$, a volatile component which vaporizes off the surface, thereby corroding the silicon. Consequently, there is a need to protect the wetted path from fluorine.

Also, some liquid bases (e.g., pH >8) or mixed acids will corrode silicon, and, therefore, there is also a need to protect the wetted path from such fluids.

In semiconductor manufacturing processes that etch silicon with fluorine, a mask is often used to cover those portions of the wafer where etching is not desired. Such masks are made of materials which are unreactive or react very slowly with fluorine. Examples of such materials are $SiO_2$, $Si_3N_4$, photoresist, or metal films of aluminum or nickel. However, these masks and the corresponding processes are used to selectively etch silicon and have not been employed to provide long-term protection of the wetted path of a MEMS device from corrosion by fluorine or other elements. In addition, such methods do not provide a means for identifying devices with inadequate coverage of the protective material.

Furthermore, such methods typically entail creating a protective metal film of aluminum or nickel by exposing aluminum or nickel layers to $ClF_3$ gas or $F_2$ gas, where the fluorine in these gases reacts with the metal to create a film, consisting of a nonvolatile fluorine compound, over the metal. The creation of the film provides a "passivating layer" on the aluminum or nickel. Materials, like aluminum and nickel, with which fluorine reacts to create a nonvolatile compound, are known to form these passivating layers. The problem with using $ClF_3$ or $F_2$ is that such gases are corrosive and highly toxic, rendering the passivation process dangerous, difficult, and expensive. For instance, exposure of silicon to $ClF_3$ can produce extreme heat and may result in catastrophic failure of the MEMS device and associated equipment.

Applying materials, such as aluminum, nickel, or other protective layers, to the wetted path of a multilayer silicon MEMS devices presents an additional challenge. Some MEMS devices, such as valve 100, are comprised of two or more silicon wafers fusion bonded together. The fusion bonding creates hidden flow passages which are difficult to access using conventional deposition or electroplating techniques, and, thus such techniques are not suitable for multi-layer MEMS devices. Atomic layer deposition ("ALD") processes can more easily reach such hidden passages, but known, true ALD techniques do not enable materials like aluminum to be deposited in layers thick enough to adequately protect the silicon.

The hidden passages in a MEMS device also present a challenge in ensuring complete protection of the wetted path. It is very important that potential defects in the protective film be screened out prior to use in a hostile environment.

Therefore, there is a need for a process for depositing, passivating, and testing a fluorine-resistant (and/or base or mixed acid resistant) material in the wetted path of a single or multilayer MEMS device that is reliable and complete and preferably employs less toxic and corrosive compounds than $ClF_3$ or $F_2$ to achieve the passivating layer.

SUMMARY OF THE INVENTION

According to one embodiment, the wetted path of a MEMS device is coated with a material capable of being passivated by fluorine. The device is then exposed to a gas that decomposes into active fluorine constituents either spontaneously or, preferably, when activated by a plasma or other energy source. One example of such a gas is $CF_4$, an unreactive gas which is easier and safer to work with than reactive gases like $ClF_3$. The gas will passivate the material and corrode any exposed silicon. The device is tested in a manner in which any unacceptable corrosion of the wetted path will cause the device to fail. If the device operates properly, the wetted path is deemed resistant to corrosion by fluorine.

As discussed above, many MEMS devices are comprised of two wafers bonded together. In one embodiment, each of the wafers, prior to bonding, is coated at least in part with a material capable of both being passivated by fluorine and forming a eutectic bond with silicon. The wafers are then attached by a eutectic bond between the material and the silicon before being exposed to $CF_4$ or other similar gas.

By applying the selected material prior to bonding, it is more likely that all parts corresponding to the wetted path, including the hidden channels formed after bonding, will be adequately coated with the material. Furthermore, choosing a material that can form a eutectic bond with silicon means the bond will be achieved at a lower temperature than the melting point of the material, thereby ensuring the wafers can be attached without destroying the material. Aluminum and nickel are examples of the materials which can be applied to passivate fluorine and form a eutectic bond with silicon.

In an alternate embodiment, an organic bonding compound, instead of a metal, is deposited in those areas of the wafer(s) corresponding to the wetted path. The organic compound creates a polymer film over the silicon in the wetted path (which acts as a barrier against fluorine or other compounds) and, in multilayer applications, it can be used to bond the wafers together. An example of such an organic bonding compound is benzocyclobutene (BCB). The steps after application of the organic bonding compound (e.g., exposure to $CF_4$ or another gas with fluorine) are the same as described above.

An optional step that can be added to both of the above-described methods is to place the processed and bonded wafer structure in a plasma activated $C_4F_8$ gas or similar compound. The step, which preferably occurs after the exposure to a fluorine-based gas, provides a protective, Teflon-like film which acts as a further barrier to attack of the silicon by fluorine compounds.

BRIEF DESCRIPTION OF THE DRAWINGS

FIG. 6 illustrates a method for producing and testing a corrosion-resistant silicon device using an organic bonding compound in accordance with one embodiment of the present invention.

FIGS. 7(a) and 7(b) illustrate an example process flow for producing a corrosion-resistant microvalve in accordance with the method illustrated in FIG. 4.

DETAILED DESCRIPTION OF EMBODIMENTS OF THE INVENTION

Figure 2:
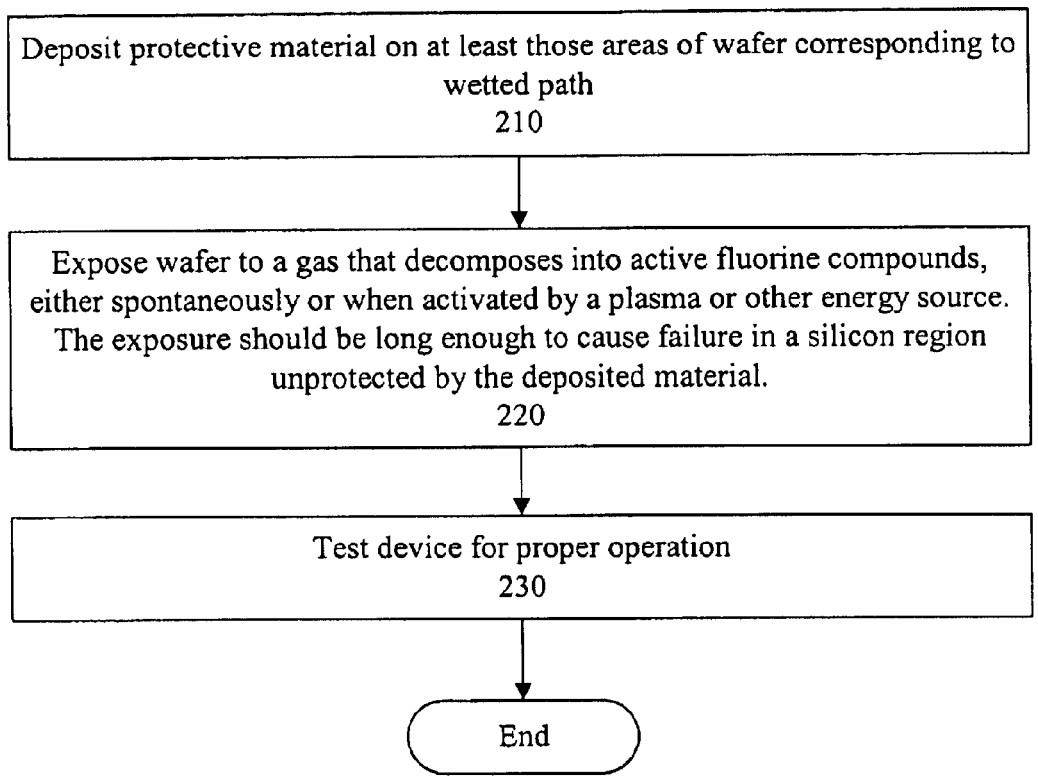
FIG. 2 illustrates a method for producing and testing a corrosion-resistant silicon device in accordance with one embodiment of the present invention.

FIG. 2 illustrates a method for producing and testing a corrosion-resistant wetted path in a silicon device according to one embodiment of the present invention. Starting with a silicon wafer(s) in which the wetted path has been formed, the protective material is applied 210 to at least those portions of the silicon wafer(s) corresponding to the wetted path. As described in further detail below, examples of such protective material include (1) a metal, such as aluminum or nickel, that can be passivated by fluorine compounds or (2) an organic compound, such as BCB, that is either resistant to fluorine or can be passivated by fluorine.

The wafer (or multi-layer wafer structure if applicable) is then exposed 220 to a gas that decomposes into active fluorine compounds, either spontaneously or when activated by a plasma or other energy source. An advantage of using an unreactive gas that requires an energy source to decompose into fluorine compounds, such as $CF_4$, is that these gases usually are safer and easier to work with than those that decompose spontaneously. The purpose of the gas exposure is to (1) passivate the deposited material (if applicable, as some organic compounds may be non-reactive to fluorine without passivation) and (2) cause failure in any silicon region in the wetted path not protected by the deposited material. The conditions of the gas exposure are preferably optimized for etching silicon, thereby rendering it probable that any exposed silicon will be attacked and can be identified through inspection or testing of the completed wafer. The exposure to the gas should be long enough to cause failure of a silicon region unprotected by the passivating material during subsequent inspection or testing.

Examples of gases that may be used are $CF_4$, $SF_6$, $NF_3$, and $ClF_3$, but those skilled in the art will appreciate that some of the other fluorine-based gases, such as certain fluorinated hydrocarbons (especially those with an effective fluorine-to-carbon ratio >2), also will decompose into active fluorine compounds that will passivate the deposited metal and etch any exposed silicon. For reference, the Semiconductor Equipment and Materials International (SEMI) draft document 3520 titled "Guidelines for Gas Compatibility with Silicon MEMS Devices" dated Sep. 24, 2002 lists many known fluorinated hydrocarbons, and those skilled in the art will appreciate that some of these will etch silicon and passivate metals like aluminum and nickel. The D. H. Flamm, et al. article "The Design of Plasma Etchants," *Plasma Chemistry and Plasma Processing*, Vol. 1(4), 1981; p. 317, also includes the etching properties of select fluorinated hydrocarbons. Both the aforementioned Flamm et al. article and the draft SEMI document 3520 are incorporated by reference as if fully disclosed herein.

After the wafer is exposed to the gas, it is subsequently tested 230 in such a way that any unacceptable corrosion of the wetted path would likely cause failure of the device. If the wetted path is not adequately protected, the fluorine compounds will corrode it during the gas exposure, and the device will not operate properly during the test. If the device operates properly, the wetted path is deemed resistant to fluorine (and possibly other fluids, depending on the type of protective material deposited).

As stated above, examples of the deposited protective material include (1) a metal that can be passivated by fluorine (e.g., aluminum, nickel) and (2) an organic compound like BCB. The above-described method is set forth in greater detail below with respect to using a metal or an organic compound as the protective material.

1. Metal Film

Figure 3:
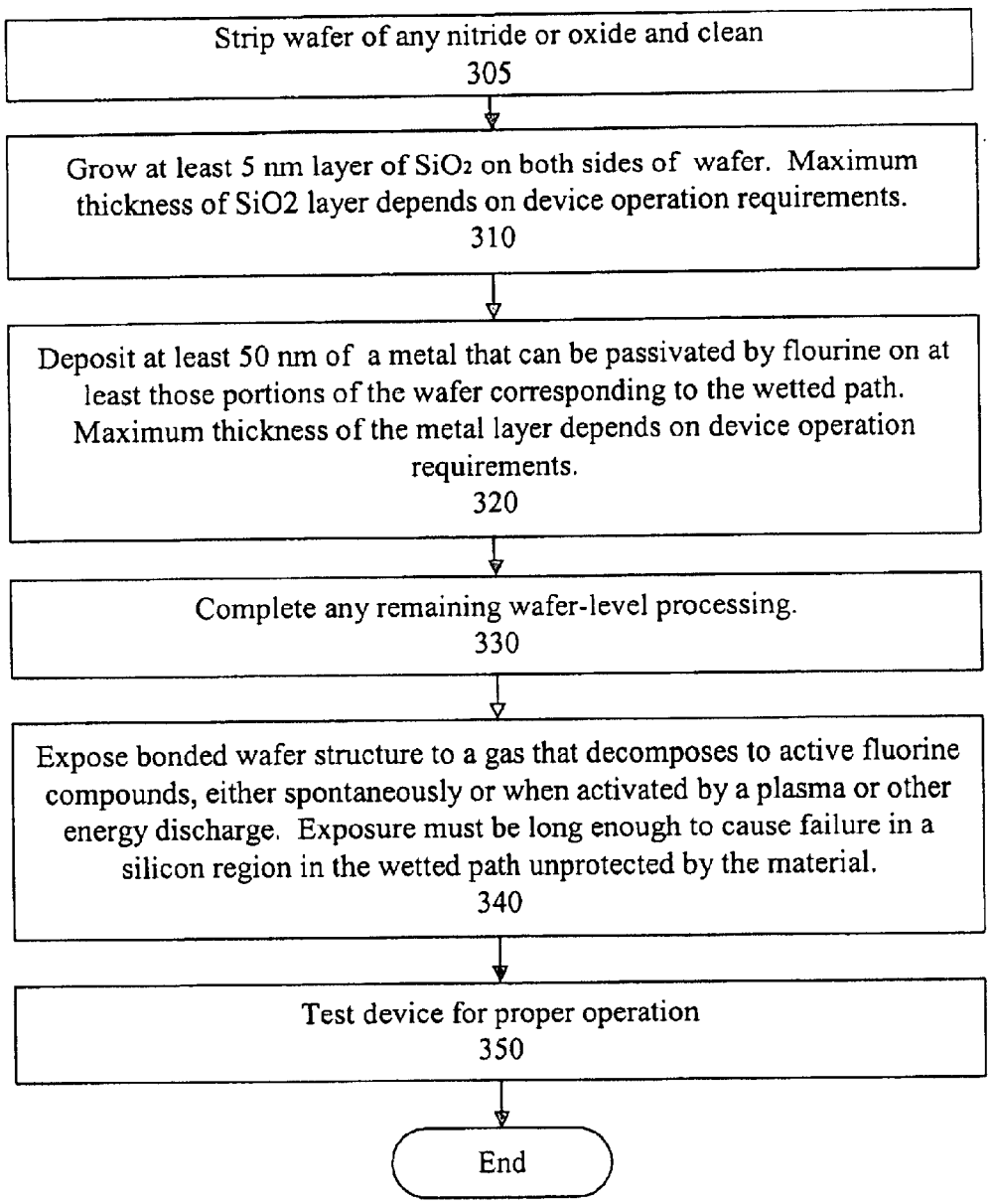
FIG. 3 illustrates a method for producing and testing a corrosion-resistant silicon device using a protective metal layer in accordance with one embodiment of the present invention.

FIG. 3 illustrates a method, according to one embodiment of the present invention, for protecting a MEMS device (or other silicon device) from corrosion by fluorine compounds by applying and passivating a metal layer in the wetted path. This method is described with respect to a single wafer, but the method is applicable to either single-layer or multilayer-wafer silicon devices. The method is as follows:

a. Starting with a completely processed wafer (i.e., complete except for protection of the wetted path), the wafer is stripped 305 of any oxide or nitride and cleaned using conventional techniques. A layer of $SiO_2$ at least 5 nanometers ("nm") thick then is grown 310 on both sides the wafer. The maximum thickness of the $SiO_2$ layer is not necessarily critical and will depend on whether there are any thickness restrictions for the wafer in order for the device being manufactured to operate properly. However, the oxide layer should not be so thick that removing exposed regions of it would damage the metal film created as set forth below.

b. At least a 50 nm layer of a metal is deposited 320 on the wafers using conventional physical vapor deposition ("PVD") or other well known techniques. As stated above, such metal should be capable of being passivated by fluorine compounds. The metal is deposited on at least those surfaces of the wafer that need to be protected from corrosion by fluorine atoms. The maximum thickness of the deposited metal layer on each wafer will depend on any thickness restrictions for the wafers due to device operation requirements.

Examples of metals which may be used are aluminum or nickel. Aluminum will react with fluorine molecules to create $AlF_3$ ($Al+3/2\ F_2 \rightarrow AlF_3$). $AlF_3$ is a non-volatile compound which forms a film over the aluminum, thereby protecting the aluminum (and, therefore, also the silicon) from reacting completely with fluorine compounds. Nickel also reacts with fluorine molecules to form a protective film, but aluminum is preferred to nickel because the nickel film does not adhere to silicon as well as the aluminum film.

c. Any additional wafer-level processing required is completed 330.

d. At any time deemed appropriate after depositing the metal layer (including prior to step 330), the wafer structure is exposed 340 to a gas that decomposes to active fluorine compounds. As stated above, one example is $CF_4$ gas in a plasma discharge, but there are other fluorine-based gases which can passivate the deposited metal and etch exposed silicon.

During the exposure, the active fluorine compounds react with the deposited material in the wetted path to create a non-volatile compound, which forms a protective film over the deposited material. The active fluorine compounds also reacts with any exposed silicon not covered by the protective film. Thus, the select gas, and the conditions of the gas exposure, are such that the gas passivates the deposited metal and etches any exposed silicon.

e. The wafer structure is tested 350 in such a way that any unacceptable corrosion of the wetted path likely would cause failure of the device. If the wetted path is not adequately protected, the fluorine will corrode it, and the device will not operate properly during the test. If the device operates properly, the wetted path is deemed to be resistant to corrosion by fluorine. The wafer structure also may be visibly inspected for any gaps in the coverage of the deposited material.

In an alternate embodiment, preferably after step (d) and prior to step (e), the wafer is placed in a plasma activated gas of $C_4F_8$. This process creates a polymer, Teflon-like film over the wafer and in the hidden channels, which provides an additional barrier to attack by fluorine compounds. During this step, the wafer temperature is maintained below 50° C. Other fluorinated hydrocarbons with an effective fluorine-to-carbon ration $\leq 2$ generally may be used as an alternative to $C_4F_8$ (for instance, a $CHF_3$ and Argon mix, which has an effective fluorine-to-carbon ratio of 2 because the hydrogen atom is treated like a carbon for determining the ratio). For reference, the article dated Oct. 16, 2000 and titled "Hydrophobic valves of plasma deposited octafluorocyclobutane in DRIE channels" by Helene Andersson, Wouter van der Wijngaart, Patrick Griss, Frank Niklaus, and Goran Stemme (the "Andersson et al. article"), the contents of which are incorporated by reference as if fully included herein, describes some of the effects of depositing $C_4F_8$ on silicon.

Figure 1A:
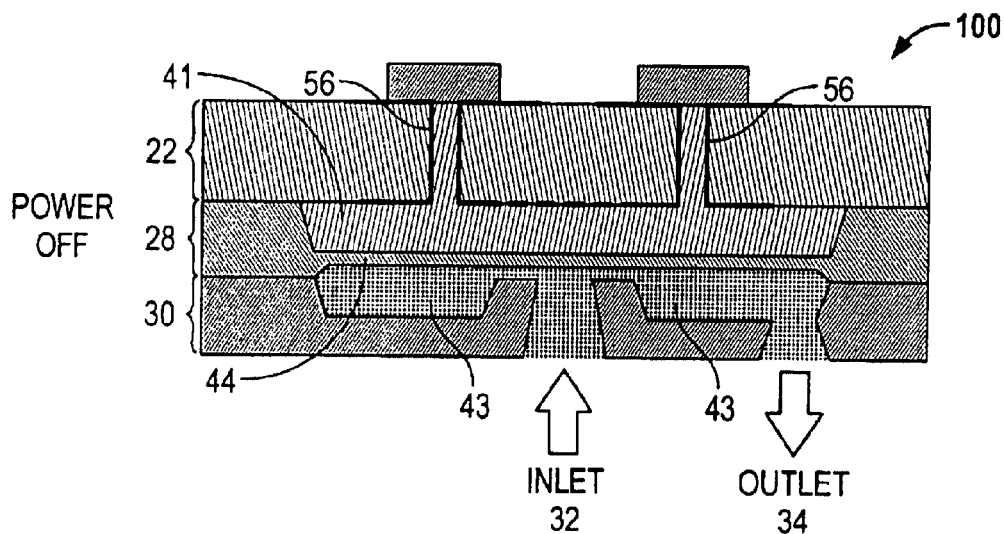
FIGS. 1(a) and (b) illustrate cross-sectional views of a known MEMS microvalve in the "off" and "on" states, respectively.
Figure 1B:
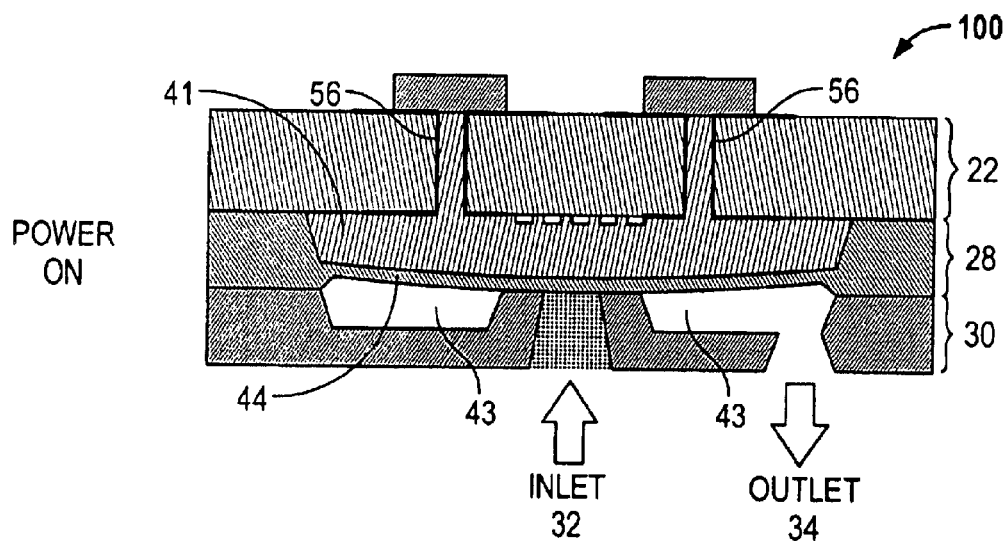
Figure 5:
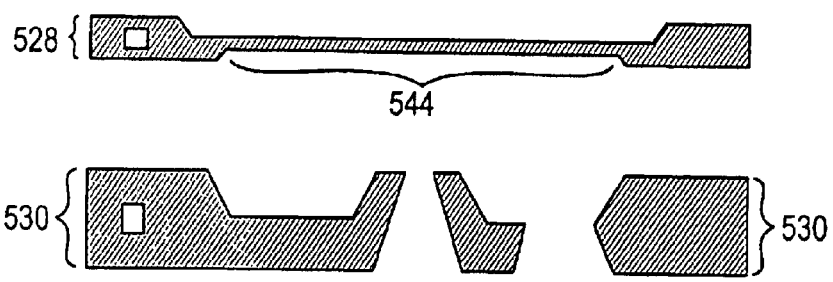
FIG. 5 illustrates the portions of an upper and lower wafer that correspond to a microvalve.
Figure 4:
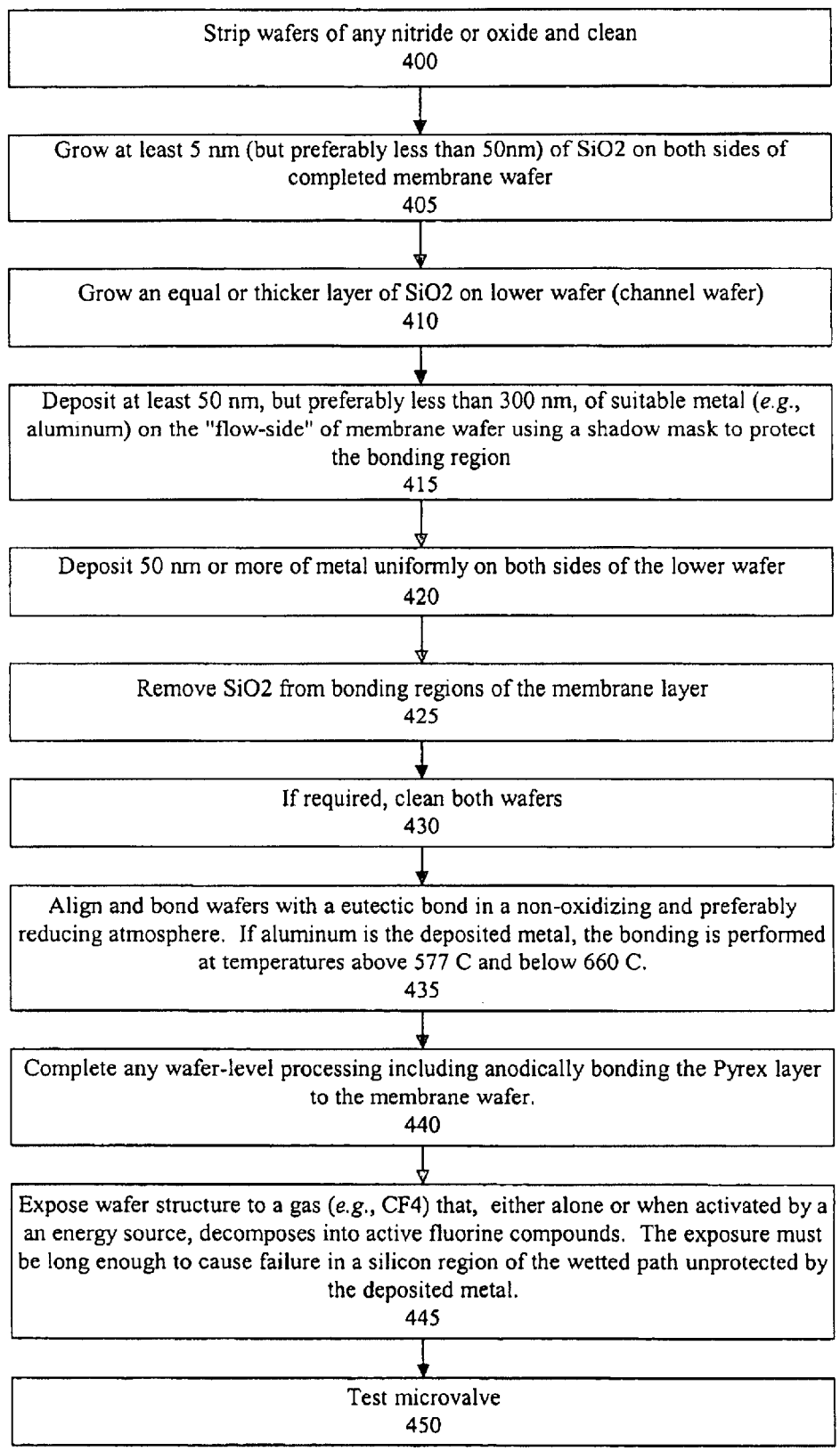
FIG. 4 illustrates a method for producing and testing a corrosion-resistant microvalve in accordance with one embodiment of the present invention.

FIG. 4 illustrates an application of the method of FIG. 3 to the manufacturing of a multilayer-wafer microvalve, such as the valve illustrated in FIGS. 1(*a*) and 1(*b*). The microvalve application is merely an example, and the method described with respect to FIG. 4 can be applied to other multilayer devices having two or more wafers. For reference, FIG. 5 illustrates the portions of the silicon membrane and channel plate wafers that correspond to the microvalve 100 illustrated in FIGS. 1(*a*) and (*b*). The method is as follows:

a. Prior to bonding, completed membrane and lower wafers 528, 530 are stripped 400 of any oxide or nitride and cleaned 400 using conventional techniques. A 5–50 nm layer of $SiO_2$ is then grown 405 on both sides of the membrane wafer 528. The $SiO_2$ is preferably no more than 50 nm thick on the membrane wafer 528 so as not to compromise the flexibility of the diaphragm 544. On both sides of the lower wafer 530 (the channel plate), a 5 nm or thicker layer of $SiO_2$ is grown 410.

b. Anywhere from 50–300 nm of a suitable metal (i.e., one that can be passivated by fluorine, preferably aluminum) is deposited 415 on all parts of the flow side of membrane wafer 528 except for bonding regions, which are protected preferably by a shadow mask. Depositing more than 300 nm may cause the passivated metal film to peel as the diaphragm 544 moves or may impair movement of the diaphragm 544 itself.

On the lower wafer 530, 50 nm or more of the metal is deposited 420 uniformly on both sides of the wafer. Care is taken to cover completely all of the vertical channels. The metal may be applied to the wafers using conventional PVD or other well known techniques.

By applying the metal prior to bonding the silicon wafers together, all parts corresponding to the wetted path are more likely to be adequately coated with the material. Since the metal is applied prior to bonding, it is advantageous to select a metal, such as aluminum or nickel, that can form a eutectic bond with silicon. Such a metal allows the wafers to be bonded without fusion bonding. Fusion bonding typically requires temperatures greater than 900° C., and the preferred metals for passivating against fluorine will melt at such temperatures. Eutectic bonding occurs at a temperature lower than the melting point of the metal and the silicon. For instance, aluminum and silicon form a eutectic bond at ~577° C., which is lower than the melting point of aluminum (~660° C.) and the melting point of silicon (1430° C.), enabling the wafers to be bonded without harm to either the aluminum or the silicon.

In steps 415 and 420, the purpose of applying metal to the bonding region of the lower wafer, but not the membrane wafer, is to enable the two wafers to be joined by a metal-silicon eutectic bond. In this microvalve example, the wafers are eutectically bonded together, but, in general, the wafers may be bonded in other ways, such as by an organic bonding compound, provided that the bonding process does not destroy the deposited metal in the wetted path. If the wafers are joined by a means other than through a eutectic bond, then the metal is not deposited in the bonding region of either wafer unless required by the selected bonding process.

c. The exposed $SiO_2$ in the bonding region of the membrane wafer 528 is then removed 425 by conventional wet or dry techniques just prior to the eutectic bonding step. Care is exercised that none or very little of the aluminum deposited on the membrane wafer 528 is removed. Subsequently, if required, the wafers 528, 530 are cleaned 430 using conventional techniques.

d. The two wafers are aligned and mated 435 through a eutectic bonding process. The bonding is done in a non-oxidizing and, preferably, reducing atmosphere (which is typically achieved by adding hydrogen to a gas stream to prevent oxidation) in a furnace. Placing the wafers on a flat surface in the furnace with additional weight, such as a one pound quartz disc, on top of them can facilitate the bonding step. For aluminum, temperatures above 577° C., but below 660° C., are preferred and may be necessary depending on the flatness of the wafers and the weight applied to them. Some example processing steps for mating the membrane wafer and the lower wafer include aligning the wafers; placing them in contact; inserting the wafer pair in the furnace on a flat surface with weight on top of them; purging the furnace with an inert gas; purging the furnace with a reducing (without being explosive) gas, such as a forming gas (10% hydrogen in nitrogen); heating the furnace to between 577° C. and 650° C. for one minute or longer, and then removing the bonded wafers.

e. A Pyrex layer (e.g., heater plate 22), which includes the heating unit for the microvalve, is anodically bonded 440 to the bonded wafer structure using conventional techniques. Also, any additional wafer-level required processing is completed.

f. Same steps as those described above with respect to step 340 in FIG. 3. In one embodiment, the wafer structure is loaded into a plasma reactor and exposed 445 to $CF_4$ at two torr for one hour at 350 watts.

g. The microvalves in the wafer structure are tested 450 to ensure proper operation. In one embodiment, the testing occurs after the wafer has been diced into individual valves. If the wetted path is not protected properly and completely by a protective film, then the fluorine compounds will have corroded the silicon in the wetted path during the fluorine-based gas exposure. As the diaphragm 544 is thin, it will break during operation if it is significantly corroded. In one embodiment, a valve die is tested by extending the membrane pneumatically to 200 psig or more. Any microvalve operating properly during testing is assumed to have resisted corrosion by fluorine components. In one embodiment, the valves are also visibly inspected for any gaps in the coverage of the protective material.

For reference, FIGS. 7(a) and (b) illustrate a more detailed example of a process flow, at the wafer and die level, for creating a microvalve in accordance with the embodiment illustrated in FIG. 4. The steps from the section titled "Eutectic Bond Process Flow" and below relate to protection of the wetted path. The steps in the sections "Upper Silicon Process" and "Lower Silicon Process" relate to etching of the wafers and not to protection of the wetted path.

2. Organic Bonding Compound

In an alternate embodiment, the silicon-formed wetted path is protected from a corrosive fluid by applying an organic bonding compound to the wafers prior to bonding. The compound creates a polymeric film over the silicon in the wetted path and, in multilayer applications, bonds the wafers together. An example of such an organic bonding compound is benzocyclobutene (BCB).

An organic bonding compound can be used to protect against fluids other than fluorine. Liquid environments of pH>8 and mixed acids will corrode silicon, and, unlike the metal films, compounds like BCB will protect the wetted path against such acids and bases, although such organic bonding compounds often are not as resistant to attack by fluorine as the metal films.

As illustrated in FIG. 6, an organic bonding compound, such as BCB, is applied 610 to at least the areas of the silicon wafer corresponding to the wetted path. In multilayer applications, the organic bonding compound may be applied to all the wafers, including the bonding regions. For example, in the microvalve application, the organic bonding compound is deposited evenly on the flow side of the membrane wafer and both sides of the lower wafer, with care taken to ensure that the vertical channels in the lower wafer are completely covered. The organic bonding compound is applied as thin as can easily be done without compromising coverage or the ability to form a hermetic seal between the wafers. In one embodiment, the thickness of the organic compound is about 2 microns.

Methods for applying an organic bonding compound to a silicon wafer are known to those skilled in the art. For reference, one such method is described in the article "Void-Free Full Wafer Adhesive Bonding," presented at the 13th IEEE Conference on Microelectromechanical Systems in Miyazaci, Japan, Jan. 23–27, 2000, pp. 247–252, by Frank Niklaus, Peter Enoksson, Edvard Kalveston, and Goran Stemme, the contents of which are hereby incorporated by reference as if the contents were fully disclosed herein. The Dow Chemical Company also has made publicly available methods for applying its BCB compound "CYCLOTENE," which is one type of BCB that may be used.

In the multilayer applications, the wafers may be bonded 620 together with the organic bonding compound. When additional hermeticity is required, the organic bonding material is circumscribed by a hermetic epoxy compound in accordance with the teaching of U.S. Pat. No. 6,325,886 B1, the contents of which are incorporated by reference as if fully disclosed herein.

The wafer structure is subsequently exposed 630 to a gas that decomposes to active fluorine compounds either spontaneously or when activated by a plasma or other energy source. As discussed in more detail above, one example of such a gas is $CF_4$ (in a plasma discharge), but there are other fluorine-based gases which can be used. The conditions of the gas exposure are preferably optimized for etching silicon, thereby rendering it probable that any exposed silicon will be corroded. In one embodiment, the wafer structure is loaded into a plasma reactor and exposed to $CF_4$ at two torr for one hour at 350 watts.

If the organic bonding compound has been properly and completely applied to the wafers, it will act as a barrier between the fluorine compounds and the silicon in the wetted path. Specifically, the organic bonding compound will either be passivated by the fluorine, non-reactive with the fluorine, or slowly reactive with the fluorine (slow enough such that it will withstand attack from fluorine during the gas exposure in step 630), depending on the particular organic compound used. To ensure complete protection, the wafer structure is tested 640 in such a way that significant corrosion of the wetted path would cause failure of the device. If the device operates properly, the organic bonding compound is presumed to completely cover the wetted path. In one embodiment of the microvalve application, the testing occurs after the wafer has been diced into valves, which are each tested by extending the membrane pneumatically to some appropriate minimum pressure (for example, 200 psig). The wafer structure may also be visibly inspected for any gaps in the coverage of the organic bonding compound.

If a particular organic compound is merely slowly reactive to fluorine compounds (as opposed to being essentially non-reactive), then such organic bonding compound will likely be used to protect the wetted path against fluids other than fluorine. Nevertheless, the aforementioned process of exposing the wafer(s) to a fluorine-based gas is still applicable (provided the reaction of the organic compound with the fluorine compounds is slow enough to withstand attack during such exposure) as a way to determine whether there are any gaps in the coverage of the organic compound. Step 630, however, is not necessarily limited to fluorine-based gases in such cases, as the step also can be accomplished by exposing the wafer to another type of fluid that is corrosive to silicon but not to the organic bonding compound.

In an alternate embodiment, preferably after step 630 and prior to the testing step, the wafer structure is placed in a plasma activated gas of $C_4F_8$. This process creates a polymer, Teflon-like film over the wafer, which provides an additional barrier to attack by fluorine compounds. During this step, the wafer temperature is maintained below 50° C. As stated above, other fluorinated hydrocarbons with an actual or equivalent fluorine-to-carbon ratio $\leq 2$ generally may be used as an alternative to $C_4F_8$ (for instance, a $CHF_3$ and Argon mix).

The above-described methods have been set forth with respect to MEMS devices, but those skilled in the art will appreciate that such methods can also be applied to other silicon devices. Furthermore, as will be understood by those familiar with the art, the invention may be embodied in other specific forms without departing from the spirit or essential characteristics thereof Accordingly, the disclosure of the present invention is intended to be illustrative and not limiting of the invention.

What is claimed is:

1. A method for protecting a wetted path of a silicon device from corrosion by fluorine atoms and for testing the adequacy of the protection, the method comprising;

coating the wetted path with a material that can be passivated by fluorine atoms;

exposing the wetted path to a gas environment, which includes fluorine atoms, that will passivate the material and corrode any exposed silicon in the wetted path;

testing the silicon device in a manner where corrosion in the wetted path is likely to cause failure of the silicon device; and in response to the silicon device operating satisfactorily during such testing, determining from such satisfactory operation that the wetted path is protected from corrosion by fluorine atoms.

2. The method of claim 1 wherein the material is one that can form a eutectic bond with silicon.

3. The method of claim 1 wherein the material is aluminum.

4. The method of claim 1 wherein the material is nickel.

5. The method of claim 1 wherein the silicon device is comprised of at least a portion of two wafers, at least one of which is silicon, bonded together and wherein regions of the wafers corresponding to the wetted path are coated with the material prior to bonding the wafers.

6. The method of claim 5 wherein the material is one that can form a eutectic bond with silicon.

7. The method of claim 6 wherein a bonding region of one of the wafers also is coated with the material and the two wafers are bonded together through a eutectic bond.

8. The method of claim 7 wherein the material is aluminum.

9. The method of claim 7 wherein the material is nickel.

10. The method of claim 1, wherein the gas environment includes a fluorinated hydrocarbon with an effective fluorine-to-carbon ratio >2.

11. The method of claim 1 wherein the gas environment is $CF_4$ activated by a plasma discharge.

12. The method of claim 1, wherein, after the material has been passivated, the wetted path is exposed to a fluorinated hydrocarbon gas with an effective fluorine-to-carbon ratio $\leq 2$ to further protect the wetted path from corrosion by the fluid.

13. The method of claim 12, wherein the fluorinated hydrocarbon gas is $C_4F_8$.

* * * * *